(12) United States Patent
Sakao

(10) Patent No.: US 6,350,647 B2
(45) Date of Patent: Feb. 26, 2002

(54) SEMICONDUCTOR MEMORY DEVICE AND MANUFACTURING METHOD OF THE SAME

(75) Inventor: Masato Sakao, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/772,981

(22) Filed: Jan. 31, 2001

Related U.S. Application Data

(62) Division of application No. 09/435,921, filed on Nov. 8, 1999.

(30) Foreign Application Priority Data

Nov. 9, 1998 (JP) .............................. 10-317214

(51) Int. Cl.[7] .......................................... H01L 21/8242
(52) U.S. Cl. ...................... 438/254; 438/253; 438/397; 438/396
(58) Field of Search ................. 438/250–256, 438/393–399

(56) References Cited

U.S. PATENT DOCUMENTS

| | | | | |
|---|---|---|---|---|
| 5,464,787 A | * | 11/1995 | Ryou | 438/396 |
| 5,580,812 A | | 12/1996 | Ikemasu et al. | |
| 5,994,197 A | * | 11/1999 | Liao | 438/396 |
| 6,107,136 A | * | 8/2000 | Melnick et al. | 438/253 |
| 6,194,758 B1 | * | 2/2001 | Tanaka et al. | 257/309 |
| 6,218,257 B1 | * | 4/2001 | Kita | 438/396 |
| 6,218,296 B1 | * | 4/2001 | Kwak et al. | 438/653 |
| 6,235,604 B1 | * | 5/2001 | King | 438/398 |

FOREIGN PATENT DOCUMENTS

| | | | |
|---|---|---|---|
| JP | 2-94564 | * | 4/1990 |
| JP | 3-25972 | * | 2/1991 |
| JP | 5-218332 | | 8/1993 |
| JP | 6-196649 | | 7/1994 |
| JP | 9-8253 | | 1/1997 |
| JP | 9-232539 | | 9/1997 |
| JP | 10-22473 | | 1/1998 |
| JP | 10-242423 | | 9/1998 |

* cited by examiner

Primary Examiner—John F. Niebling
Assistant Examiner—Jennifer M Kennedy
(74) Attorney, Agent, or Firm—Sughrue Mion, PLLC

(57) ABSTRACT

A plurality of charge storage electrodes are formed on an interlayer insulating film which is formed on a silicon substrate. A plurality of insulating members which surround periphery of the charge storage electrodes and which are separated from each other are formed. A capacitance insulating film is so formed as to cover the plurality of charge storage electrodes and the plurality of insulating members. A plate electrode is formed on the capacitance insulating film. The insulating members are formed of a silicon nitride film which has a function as an etching stopper for protecting the interlayer insulating film.

5 Claims, 7 Drawing Sheets

SEMICONDUCTOR MEMORY DEVICE AND MANUFACTURING METHOD OF THE SAME

This a divisional of application Ser. No. 09/435,921 (Confirmation No. Not Assigned) filed Nov. 8, 1999, the disclosure of which is incorporated herein by reference.

BACKGROUND OF THE INVENTION

1. Field of the Invention

The present invention relates to a semiconductor memory device and a method of manufacturing the same, and more particularly to a semiconductor memory device having a stacked capacitor and a manufacturing method the same.

2. Description of the Related Art

A Dynamic Random-Access Memory (DRAM) is known as a typical semiconductor memory device which is highly integrated. The DRAM includes memory cells, etc., each of which is composed of one switching transistor and one capacitor.

The reason why each memory cell is thus structured is because a chip area of each memory cell can be easily reduced. In general, a MOSFET (Metal-oxide-Semiconductor Field-Effect Transistor) is employed as the switching transistor.

In order to stably operate a DRAM, it is required that the capacity of the capacitor in each memory cell is made large. However, if the chip area of each memory cell is reduced, the capacity of the capacitor becomes small, therefore, the stable operation of the DRAM is not secured. In order to expand the capacity of the capacitor while reducing the chip area of each memory cell, improved structures of the memory cell have been developed and proposed.

Unexamined Japanese Patent Application KOKAI Publication No. H5-218332 discloses a memory cell in which a storage electrode (charge storage electrode) is formed in a cylindrical shape. In such a memory cell, when forming the storage electrode, an interlayer insulating film needs to be prevented from being etched. Thus, an etching stopper formed of a silicon nitride film, etc., is formed as to cover the entire area between the adjacent storage electrodes on the interlayer insulating film.

U.S. Pat. No. 5,580,812 discloses a memory cell, in which a charge storage electrode is formed in a cylindrical shape, and a silicon nitride film is so formed on an interlayer insulating film as to cover the entire area between adjacent charge storage electrodes. The aforementioned patent application is hereby incorporated herein by reference in its entirety.

In the memory cell disclosed both in Unexamined Japanese Patent Application KOKAI Publication No. H5-218332 and U.S. Pat. No. 5,580,812, the silicon nitride film covers the entire area between the adjacent charge storage electrodes. This entails a problem that a crack is likely to occur in the silicon nitride film. The crack may occur, since the silicon nitride film is heated up and cool down in various heat processes which are carried out after the formation of the capacitor, thereby thermal expansion and thermal shrinkage of the silicon nitride film are repeated. Once the crack occurs in the silicon nitride film, insulation performance of the memory cell fall off. Such crack may occur not only in the area between the adjacent charge storage electrodes, but also in an area away from the memory cell array.

The silicon nitride film covers the entire area between the adjacent charge storage electrodes. This interrupts a hydrogen atom being added into the interlayer insulating film or the semiconductor substrate, in a hydrogen anneal process carried out after the formation of the memory cell. If the hydrogen atom is thus not added into the interlayer insulating film or the semiconductor substrate, a hydrogen anneal process for improving an interface state caused by an etching process can not be performed. As a result of such an interface state, a threshold voltage value of a MOSFET for switching may vary, and a leak current may increase. Thus, information storage characteristics of the memory cells are deteriorated.

Furthermore, in the memory cell disclosed both in Unexamined Japanese Patent Application KOKAI Publication No. H5-218332 and U.S. Pat. No. 5,580,812, a leaf-like projection is likely to remain on the charge storage electrodes having a circular cylindrical shape. Unexamined Japanese Patent Application KOKAI Publication No. H9-232539 discloses a method of manufacturing a semiconductor memory device, while removing a leaf-like projection in an oxidation process in which the projection is oxidized and etched using hydrofluoric acid. However, this method causes a complicated manufacturing process of the semiconductor memory device.

A method for manufacturing a semiconductor memory device without using a silicon nitride film as an etching stopper has been proposed.

For example, Unexamined Japanese Patent Application KOKAI Publication No. H6-196649 discloses a method of manufacturing a semiconductor memory device, in which impurities are added into a silicon oxidation film for forming electrodes, and an etching process is performed using vapor phase hydrofluoric acid while using the silicon oxidation film on an interlayer insulating film as an etching stopper, thereby selectively removing only the silicon oxidation film for forming electrodes.

Unexamined Japanese Patent Application KOKAI Publication No. H10-22473 discloses a method of manufacturing a semiconductor memory device, in which a difference in density between two silicon oxidation films is made and a silicon oxidation film having low density is selectively removed.

The methods cause a complicated manufacturing process of the semiconductor memory device as well.

SUMMARY OF THE INVENTION

Accordingly, the present invention has been made in consideration of the above, and an object thereof is to provide a method of manufacturing a semiconductor memory device, in which performance of memory cells is prevented from being deteriorated, and a semiconductor memory device manufactured by this method.

Another object of the present invention is to provide a semiconductor memory device, in which a crack is prevented from occurring in an insulating film having a function as an etching stopper without interrupting a hydrogen anneal process which is carried out after the formation of a memory cell, and a semiconductor memory device manufactured by this method.

In order to achieve the above-described objects, according to the first aspect of the present invention, there is provided a semiconductor memory device comprising:

a semiconductor substrate;

an interlayer insulating film which is formed on the semiconductor substrate;

a plurality of charge storage electrodes which are formed on the interlayer insulating film;

a plurality of insulating members which are formed and separated from each other on the interlayer insulating film, so as to surround periphery of the plurality of charge storage electrodes;

a capacitance insulating film which is so formed as to cover the plurality of charge storage electrodes and the insulating members; and a plate electrode which is formed on the capacitance insulating film.

In the semiconductor memory device of the present invention, the plurality of insulating members are formed and separated on the interlayer insulating film as to cover the periphery of the respective charge storage electrodes, without covering the entire area between the adjacent charge storage electrodes. Even if the insulating members are heated up and cool down in various heat processes carried out after the formation of the capacitor, a stress caused by thermal expansion and thermal shrinkage of the insulating members and applied thereto is small. Accordingly, a crack is not likely to occur in the insulating members.

Each of the insulating members does not cover the entire area between the adjacent charge storage electrodes, therefore, a hydrogen anneal process for adding a hydrogen atom into the interlayer insulating film or the semiconductor substrate is preferably performed without being obstructed by the presence of the insulating member. Changes in a threshold voltage value of a MOSFET for switching and an increase in a leak current can be controlled. As a result of this, information storage characteristics of the memory cell can be improved, periodic refresh operations can be processed at long intervals.

As explained above, the insulating members are so formed as to surround the periphery of the respective charge storage electrodes. Thus, even if the position of a contact hole prepared for connecting a switching transistor deviates from the position of the corresponding charge storage electrode, the contact hole is not exposed as long as it stays within an area covered by the insulating member. Thus, the center of the contact holes does not have to strictly correspond to the center of the charge storage electrode.

If the upper surface of each charge storage electrode is concaved, the surface area thereof increases. Specifically, in a case where the charge storage electrodes have the bottom and are formed in a cylindrical shape, the surface area thereof increases. In such a case, the capacity of the capacitor can be increased without increasing the chip area.

It is preferred that a silicon dioxide film is used as the interlayer insulating film, while a silicon nitride film is used as the insulating film. In this case, a desired etching selective ratio (a difference between etching rates) of the silicon nitride film with respect to the silicon dioxide film can be easily obtained.

According to the second aspect of the present invention, there is provided a method of manufacturing a semiconductor memory device, comprising:

forming a first insulating film on an interlayer insulating film which is formed on a semiconductor substrate;

forming a second insulating film on the first insulating film;

forming a plurality of openings in the first and second insulating films;

forming a plurality of charge storage electrodes on the interlayer insulating film by arranging an electric conductor in each of the openings;

forming a plurality of sidewalls surrounding the charge storage electrodes on the first insulating film, by removing the second insulating film;

etching the first insulating film using the sidewalls as an etching mask, and removing the first insulating film except under each of the sidewalls, so as to form, on the interlayer insulating film, a plurality of insulating members which surround periphery of the charge storage electrodes and which are separated from each other;

removing each of the sidewalls;

forming a capacitance insulating film which covers the charge storage electrodes and the insulating members; and forming a plate electrode on the capacitance insulating film.

In the method of manufacturing the semiconductor memory device of the present invention, the first and second insulating films are formed on the interlayer insulating film, thereafter forming the charge storage electrodes respectively in the plurality of openings formed in the first and second insulating films. Then, the second insulating film is removed therefrom, and the plurality of sidewalls surrounding the charge storage electrodes are formed on the first insulating film. Furthermore, the first insulating film is etched while using the sidewalls as etching masks. Then, the plurality of insulating members which surround the periphery of the charge storage electrodes and which are separated from each other are formed. In this manufacturing method, the first insulating film has a function as an etching stopper protecting the interlayer insulating film. After the sidewalls are removed, the capacitance insulating film covering the charge storage electrodes and the insulating members is formed. The plate electrode is formed on the capacitance insulating film, whereby the semiconductor memory device is manufactured.

The electric conductor is formed, for example, in the openings and the second insulating film, and etched back until the surface of the second insulating film is exposed, so that the charge storage electrodes are formed. In this case, the electric conductor does not remain on the surface of the second insulating film.

The electric conductor is so arranged along inner walls of the openings, and upper surfaces of the plurality of charge storage electrodes are concaved. In such a case, the charge storage electrodes are formed in a cylindrical shape having bottom, resulting in an increase in the capacity of the capacitor.

After forming the interlayer insulating film, if a heat process for heating the interlayer insulating film in order to shape the film is performed, an etching rate of the interlayer insulating film can be lowered. Thus, the interlayer insulating film is not likely to be etched in a process for removing the sidewalls.

It is preferred that a silicon dioxide film is used as the interlayer insulating film, while a silicon nitride film is used as the first insulating film. In this case, a desired etching selective ratio (a difference between etching rates) of the silicon nitride film with respect to the silicon dioxide film can be easily obtained.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

Embodiments of the present invention will now be specifically explained with reference to the accompanying drawings.

(First Embodiment)

Figure 1:
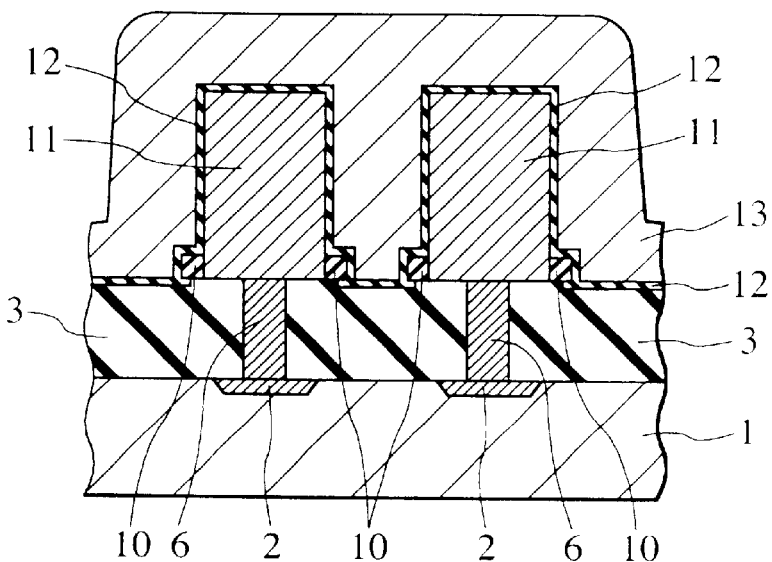
FIG. 1 is a cross sectional view of a main part of a semiconductor memory device according to the first embodiment of the present invention.

FIG. 1 depicts a semiconductor memory device according to the first embodiment of the present invention. The depicted semiconductor memory device is a DRAM (Dynamic Random-Access Memory) having a stacked capacitor. The semiconductor memory device (DRAM) includes a plurality of memory cells which are arranged on a silicon substrate. In this embodiment, an explanation will be made to an example of two memory cells which are adjacent with each other. The semiconductor memory device of the present invention comprises a capacitor and a transistor having the structure which is substantially identical with that of the conventional transistor. Furthermore, bit and word lines which are included in the semiconductor memory device and which are not directly related to the present invention also have the structure identical with that of the conventional bit and word lines.

As shown in FIG. 1, the semiconductor memory device comprises a silicon substrate 1, source areas 2, an interlayer insulating film 3, polysilicon plugs 6, insulating members 10, charge storage electrodes 11, a capacitance insulating film 12 and a plate electrode 13.

The silicon substrate 1 is made of p-type single crystal silicon, etc. A plurality of n-type source areas 2 are formed below the upper surface of the silicon substrate 1. Then, the interlayer insulating film 3, which is made of silicon dioxide ($SiO_2$), etc., is formed on the silicon substrate 1. A plurality of contact holes 5 are formed in the interlayer insulating film 3. Each of the plurality of contact holes 5 is formed in a position corresponding to the source area 2. The polysilicon plugs 6, which are made of polysilicon, etc., are respectively formed in the contact holes 5. The polysilicon plugs 6 is so formed that its upper surface is in one plane with the upper surface of the interlayer insulting film 3.

Each of the charge storage electrodes 11, which are made of polysilicon, etc., is formed in a position corresponding to each polysilicon plug 6 in the interlayer insulating film 3. In the illustration, the charge storage electrodes 11 are formed in a rectangular shape. The insulating members 10, which are made of silicon nitride ($SiN_x$), etc., are so formed as to surround the circumference of the charge storage electrodes 11. The insulating members 10 are formed in a rectangular-ring-like shape which corresponds to the shape of the charge storage electrodes 11. The insulating members 10 are respectively formed around the charge storage electrodes 11 in such a way that the insulating members 10 are separated from each other.

The capacitance insulating film 12 is so formed on the interlayer insulating film 3 as to cover the charge storage electrodes 11 and the insulating members 10. The capacitance insulating film 12 is formed of laminated layers of a silicon dioxide film and a silicon nitride film. The plate electrode 13, which is made of n-type polysilicon, etc., is formed over the capacitance insulating film 12.

Accordingly, a capacitor included in a memory cell is formed of a single charge storage electrode 11 on which the capacitance insulating film 12 and the plate electrode 13 are formed.

A method for manufacturing the semiconductor memory device having the above-described structure will now be described.

Figure 2A:
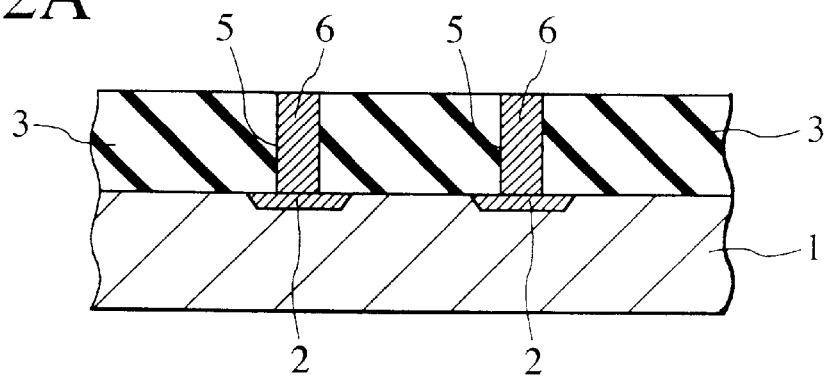
FIGS. 2A to 2H are cross sectional views of a main part of the semiconductor memory device in a manufacturing process.

The semiconductor memory device according to the first embodiment is manufactured in accordance with the processes shown in FIGS. 2A to 2H. First, as illustrated in FIG. 2A, the n-type source areas 2 are formed in a certain position below the upper surface of the p-type silicon substrate 1, by implanting n-type impurities therein by such means as ion implantation, etc.

A silicon dioxide film is formed on the silicon substrate 1 (including the areas where the source areas 2 are formed) using the CVD method, etc., so as to form the interlayer insulating film 3.

Next, the interlayer insulating film 3 is selectively etched using such general means as the lithography technology and the dry-etching technology. The contact holes 5 having a cylindrical shape in the interlayer insulating film 3 are formed, thereby the source area 2 are exposed.

Thereafter, the polysilicon plug 6 is formed in the contact holes 5, by arranging a polysilicon film (not illustrated) including the n-type impurities is arranged in the contact holes 5 and on the interlayer insulating film 3, using the CVD method or the like. The polysilicon film is so arranged as to fill up each contact hole 5. The polysilicon film is then etched back using the dry etching technology until the surface of the interlayer insulating film 3 is exposed, while remaining in the contact holes 5. Accordingly, the polysilicon plug 6 is formed therein as shown in FIG. 2A.

Figure 2B:
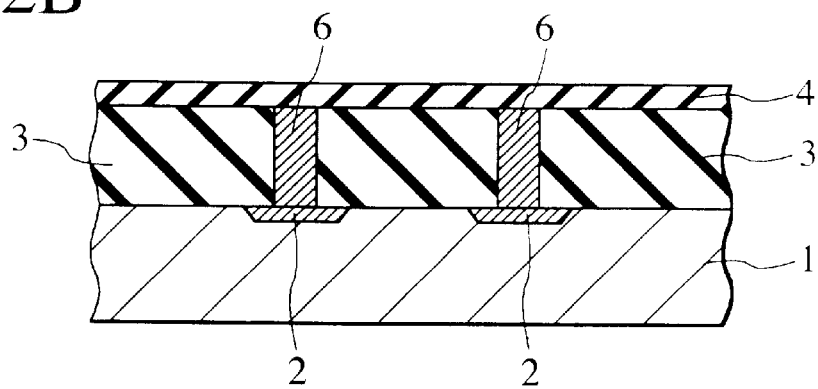

As illustrated in FIG. 2B, a silicon nitride ($SiN_x$) film 4 is formed on the surface of the interlayer insulating film 3, using the CVD method, etc. The silicon nitride film 4 has a function as an etching stopper for protecting the interlayer insulating film 3 in an etching process, as will be explained later.

Figure 2C:
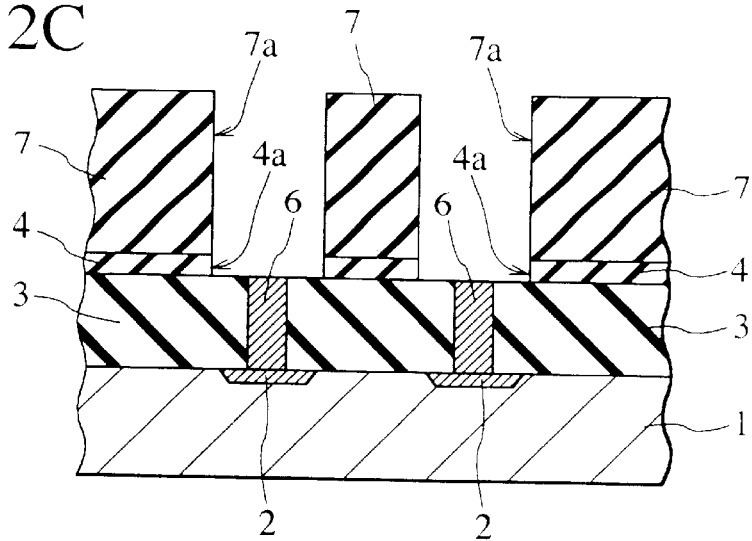

A silicon dioxide film 7 is formed on the silicon nitride film 4, using the CVD method, etc. Then, the silicon dioxide film 7 and the silicon nitride film 4 therebelow are selectively etched in sequential order, using the general lithography technology and the dry etching technology. As shown in FIG. 2C, openings 7a and 4a, formed in a rectangular shape, are formed respectively in the silicon dioxide film 7 and the silicon nitride film 4. Then, the contact holes 5 (polysilicon plugs 6) corresponding to the silicon dioxide film 7 and the silicon nitride film 4 are exposed.

Figure 2D:
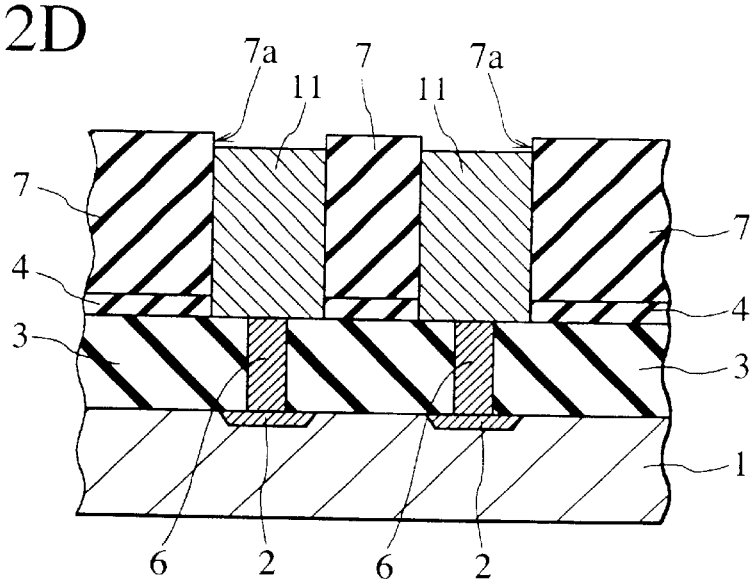

Subsequently, the charge storage electrodes 11 are formed, by forming a polysilicon film (not illustrated) including the n-type impurities in the openings 7a and 4b and on the silicon dioxide film 7, using the CVD method, etc. Particularly, the polysilicon film is so formed as to fill up the openings 7a and 4a. Then, the polysilicon film is etched back using the dry etching technology, until the surface of the silicon dioxide film 7 is exposed, thereby remaining in the openings 7a and 4a. Accordingly, the charge storage electrodes 11 which are made of polysilicon, etc. are thus formed, as illustrated in FIG. 2D. The lower surfaces of the charge storage electrodes 11 contact the corresponding polysilicon plugs 6 in the contact holes 5.

As shown in FIG. 2D, the polysilicon film is etched back, so that its upper surface becomes slightly lower than the upper surface of the silicon dioxide silicon film 7. Etching back the polysilicon film causes different etching speeds in the etching process performed in the silicon substrate 1. This results in that the polysilicon film remains without being etched in a position where the etching rate is low. Taking this into consideration, the polysilicon film is so etched back that its upper surface becomes lower than the upper surface of the silicon dioxide film 7 and that the polysilicon film as the material of the charge storage electrodes 11 does not remain on the silicon dioxide film 7. Accordingly, the upper surfaces of the charge storage electrodes 11 are slightly lower than the upper surfaces of the silicon dioxide films 7. As a result of the above, the polysilicon film does not remain on the surfaces of the silicon dioxide films 7.

Figure 2E:
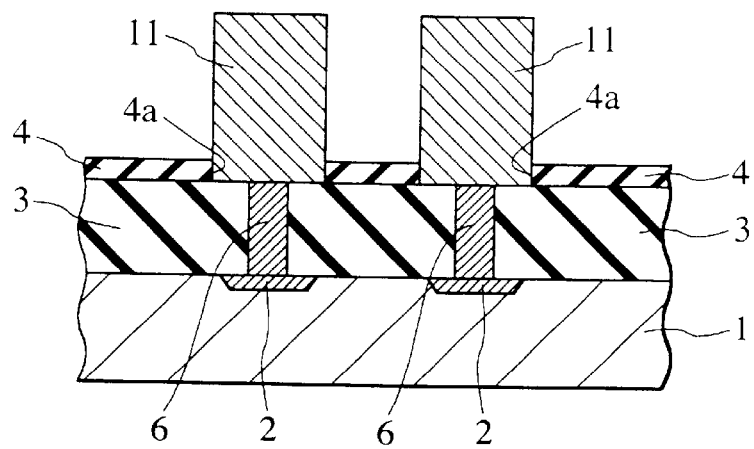

The silicon dioxide film 7 is removed using the wet etching technology using dilute hydrofluoric acid, etc. In this case, the silicon nitride film 4 has a function as an etching stopper for protecting the interlayer insulating film 3. Thus, the interlayer insulating film 3 is not etched. The silicon nitride film 4 is exposed, as illustrated in FIG. 2E, and also the charge storage electrodes 11 are exposed upward from the openings 4a of the silicon nitride film 4.

Figure 2F:
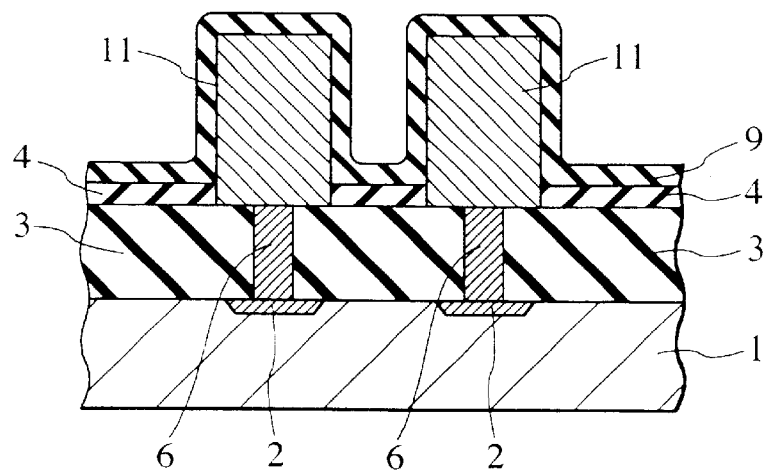

A silicon dioxide film 9 is so formed over the entire surface of the substrate 1 using the CVD method, etc., as to cover the charge storage electrodes 11 and the silicon nitride film 4, as shown in FIG. 2F.

The silicon nitride film 9, which has been thus formed, is so etched back using the dry etching technology that it remains only on the periphery of the charge storage electrodes 11, thereby forming insulating sidewalls 9a. The sidewalls 9a are formed in a rectangular-ring-like shape, and surround the outer circumstance of their corresponding charge storage electrodes 11.

Figure 2G:
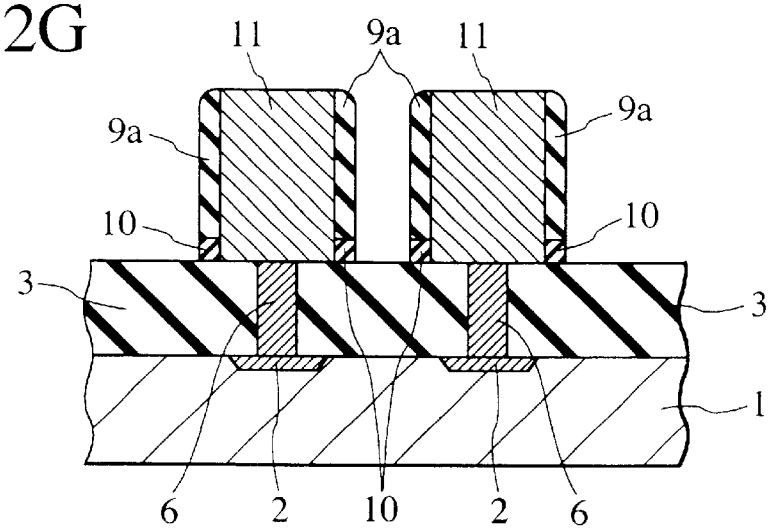

Anisotropic etching is conducted toward the silicon nitride film 4, while the sidewalls 9a are used as etching masks, thereby the silicon nitride film 4 is removed except below the sidewalls 9a. As a result of this, as shown in FIG. 2G, the insulating members 10, which are formed of silicon nitride film 4, are formed below the sidewalls 9a. The insulating members 10 are formed in the rectangular-ring-like shape likewise the sidewalls 9a, and surround the periphery of the charge storage electrodes 11. The width of the insulating members 10 is appropriately set as to correspond to the intervals between the adjacent charge storage electrodes 11. The width of the insulating members 10 corresponds to the thickness of the silicon dioxide film 9. Therefore, the thickness of the silicon dioxide film 9 is set as to correspond to the width of the insulating members 10.

Figure 2H:
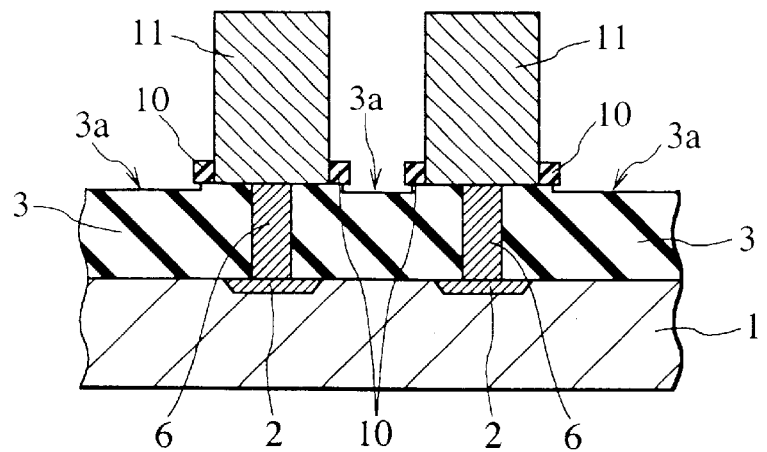

Subsequently, the sidewalls 9a are removed using the wet etching technology using dilute hydrofluoric acid, etc. As illustrated in FIG. 2H, the charge storage electrodes 11 having the rectangular-ring-like shape and the insulating members 10 surrounding the periphery of the electrodes 11 are formed on the interlayer insulating film 3. In the above-described wet etching technology, the interlayer insulating film 3 which is not covered any of the insulating members 10 is slightly etched, thereby cavities 3a shown in FIG. 2H are formed in the surface of the interlayer insulating film 3. For the sake of easy comprehension, the cavities 3a in the interlayer insulating film 3 are described in an enlarged scale, therefore, the actual cavities 3a are smaller than those in the illustration. Thus, any serious problems should not occur because of the presence of the cavities 3a.

The surface area of the charge storage electrodes 11 is nitrided, by heating the area in the atmosphere including nitrogen. Then, a silicon nitride film (not illustrated) is so formed as to cover all the charge storage electrodes 11, the insulating members 10 and the exposed surface of the interlayer insulating film 3, using the CVD method, etc. The charge storage electrodes 11 are so oxidized using the thermal oxidation method as to form the capacitance insulating film 12 having the laminated layer structure, in which a silicon dioxide film and a silicon nitride film are laminated.

The plate electrode 13 is formed on the capacitance insulating film 12, by arranging a polysilicon film including the n-type impurities, etc.

A capacitor included in a memory cell is thus formed of a single charge storage electrode 11 on which the capacitance insulating film 12 and the plate electrode 13 are formed.

After the capacitor of a memory cell is formed, a hydrogen anneal process is performed in order to implant a hydrogen atom into the interlayer insulating film 3 and the semiconductor substrate 1 in a hot atmosphere. The hydrogen anneal process is a process for improving an interface state caused as the result of the etching, by implanting the hydrogen atom into the semiconductor substrate 1 so as to recover a lattice defect occurring in the semiconductor substrate 1.

Figure 3A:
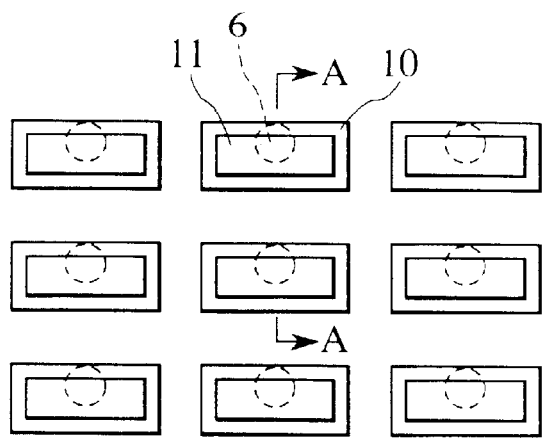
FIG. 3A is a cross sectional view showing a layout of the semiconductor memory device.
Figure 3B:
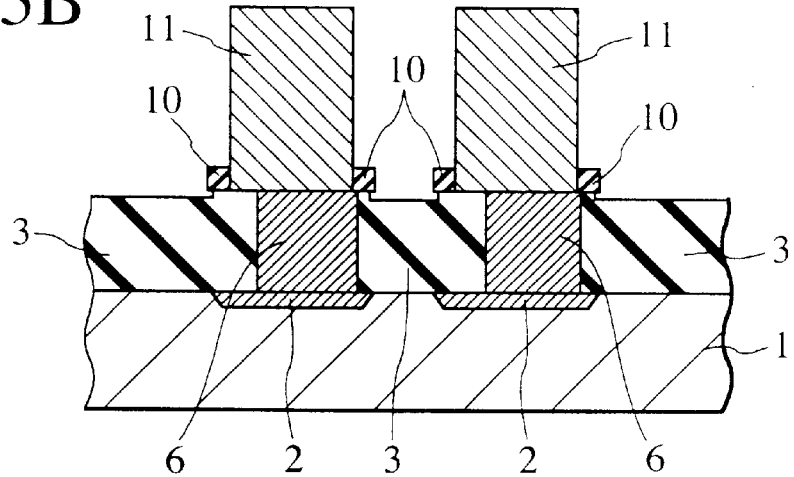
FIG. 3B is a partial cross sectional view taken along a line A—A shown in FIG. 3A.

FIG. 3A is a schematic plane view of a semiconductor memory device and shows a layout of memory cells. FIG. 3B is a cross section taken along a ling A—A shown in FIG. 3A. For the sake of easy explanation, FIGS. 3A and 3B illustrate the charge storage electrodes 11 whose width is narrower than the width of those described in the first embodiment. In the illustration, the center of each charge storage electrode 11 deviates from the center of its corresponding contact hole 5 formed in the interlayer insulating film 3.

It is difficult to form each of the charge storage electrodes 11 in a position where the center corresponds to the center of the contact hole 5. If the charge storage electrodes 11 extremely deviate from the center of the contact holes 5, the contact holes 5 are exposed. As shown in FIGS. 3A and 3B, in a case where there is no great difference between the width of the charge storage electrodes 11 and the diameter of the contact holes 5, the contact holes 5 are likely to be exposed.

In the semiconductor memory device according to this embodiment, each of the insulating members 10 is so formed as to surround the lower periphery of the corresponding charge storage electrode 11, as shown in FIGS. 3A and 3B. In a case where the position of the contact hole 5 prepared for connecting a switching transistor deviates from the position of the charge storage electrode 11 to a certain extent, the contact hole 5 is not exposed as long as it stays within an area which is covered by the insulating member 10. Thus, the center of the contact holes 5 does not have to strictly correspond to the center of the charge storage electrode 11.

As explained above, in the semiconductor memory device according to this embodiment, each of the plurality of insulating members 10 is so separately formed from one to another as to surround the lower periphery of each corresponding charge storage electrode 11. Therefore, each of the insulating members 10 does not cover the entire area which is formed between the adjacent charge storage electrodes 11.

Even if the insulating members 10 are heated up and cool down in a following manufacturing process, a stress which is caused by thermal expansion and thermal shrinkage of the insulating members 10 and which is applied thereto is small. Thus, no crack is likely to occur in the insulating members 10.

Because each insulating member 10 does not cover the entire area between the adjacent charge storage electrodes 11, the presence of the insulating member 10 unlikely obstructs the hydrogen atom to be implanted into the interlayer insulating film 3 and the semiconductor substrate 1. Changes in a threshold voltage value of a MOSFET for switching and an increase in a leak current can be controlled. As a result of this, an improvement in the information storage characteristics of the memory cells is achieved. For example, refresh operations can be carried out at long intervals.

As explained above, each of the insulating members 10 is so formed as to surround the lower periphery of the charge storage electrode 11. Therefore, even if the position of the contact hole 5 obviously deviates from the position of the charge storage electrode 11, the contact hole 5 is not exposed as long as it stays within an area which is covered by the insulating member 10. Accordingly, the center of the contact holes 5 and the center of the charge storage electrode 11 do not have to strictly correspond to each other.

In the semiconductor memory device according to this embodiment, a silicon nitride film serves as the insulating member 10, thereby a desired etching selective ratio (difference between etching rates) of the silicon nitride film with respect to the silicon dioxide film can be easily obtained.

The polysilicon film is etched back, so that its upper surface becomes slightly lower than the upper surface of the silicon dioxide silicon film, therefore, the polysilicon film does not remain on the surface area of the silicon dioxide film 7.

(Second Embodiment)

The second embodiment of the present invention will now be explained.

Figure 4:
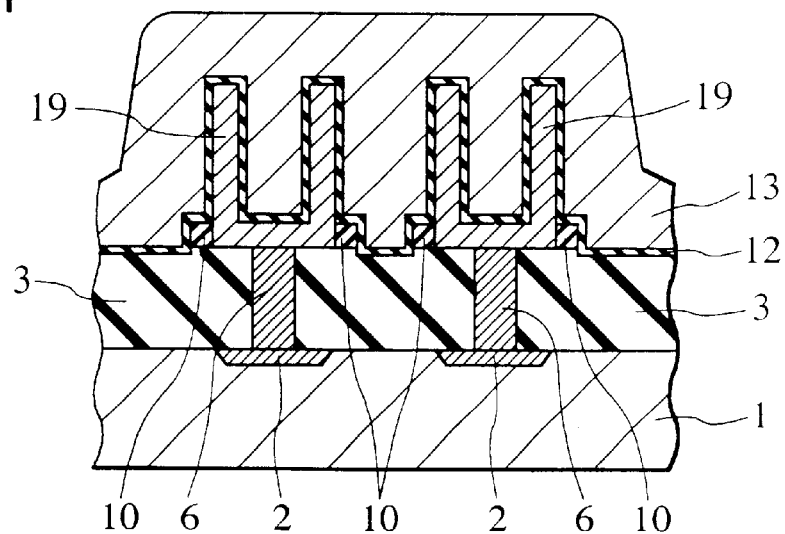
FIG. 4 is a cross sectional view of a main part of a semiconductor memory device according to the second embodiment of the present invention.

FIG. 4 illustrates a semiconductor memory device according to the second embodiment of the present invention.

As shown in FIG. 4, the semiconductor memory device of this embodiment has the structure which is the same as that explained in the first embodiment, except that the charge storage electrodes 11 have the bottom and are formed in a cylindrical shape.

The semiconductor memory device of this embodiment is manufactured in accordance with the processes shown in FIGS. 5A to 5I.

Figure 5A:
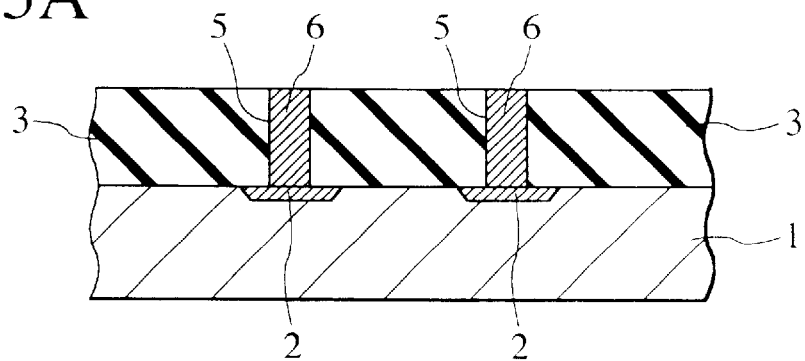
FIGS. 5A to 5I are cross sectional views of a main part of the semiconductor memory device in a manufacturing process.

As shown in FIG. 5A, the n-type source areas 2 are formed below the upper surface of the p-type silicon substrate 1. Then, the interlayer insulating film 3 is formed by arranging a silicon dioxide film on the silicon substrate 1. A plurality of contact holes 5 are formed in the interlayer insulating film 3. The polysilicon plugs 6, which are made of polysilicon, etc., are respectively formed in the contact holes 5.

Figure 5B:
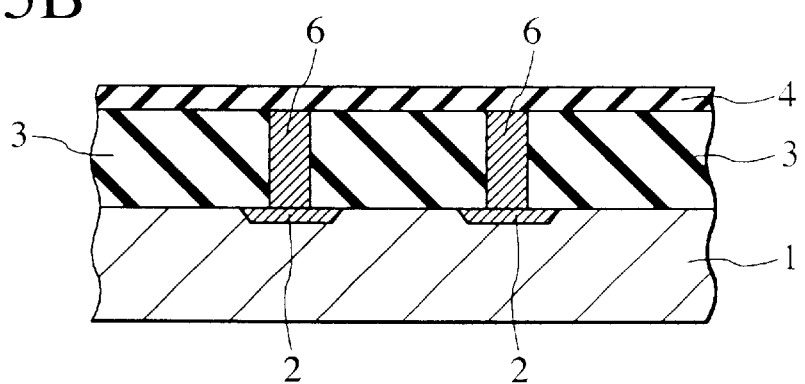
Figure 5C:
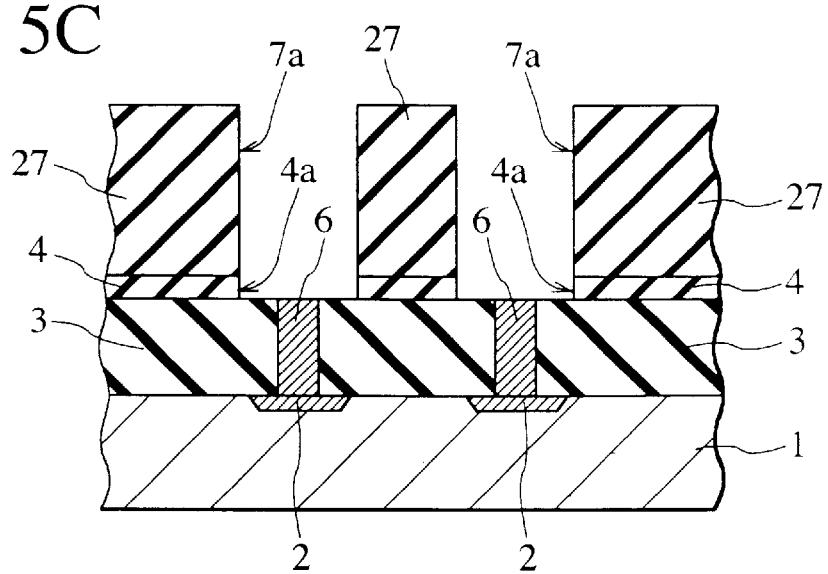

Next, likewise the first embodiment, as shown in FIG. 5B, the silicon nitride film 4 is formed on the surface of the interlayer insulating film 3. Then, a silicon dioxide film 27 is formed on the silicon nitride film 4. Subsequently, the silicon dioxide film 27 and the silicon nitride film 4 are selectively etched in sequential order, and openings 27a and 4a are thus formed respectively in the silicon dioxide film 27 and the silicon nitride film 4. Accordingly, the semiconductor memory device having the structure which is shown in FIG. 5C is manufactured and which is substantially the same as that shown in FIG. 2C.

In the second embodiment, unlike in the first embodiment, as the silicon dioxide film 27, it is preferred to use a silicon dioxide film into which impurities are implanted, such as a BoroPhosphoSilicate Glass (BPSG) film into which boron and phosphorus are implanted or a PhosphoSilicate Glass (PSG) film into which phosphorus is implanted. Such a film is used in order to obtain a difference between etching rates of silicon dioxide having impurities (doped) and silicon dioxide having no impurities (undoped).

Figure 5D:
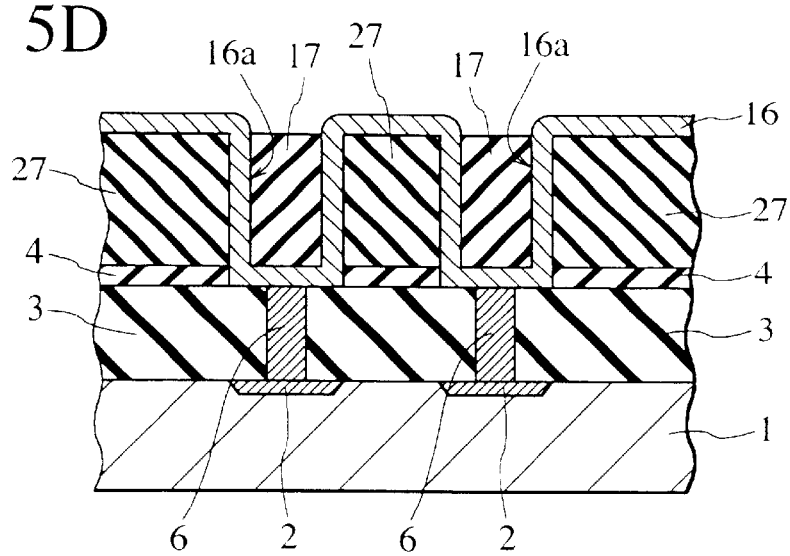
Figure 5E:
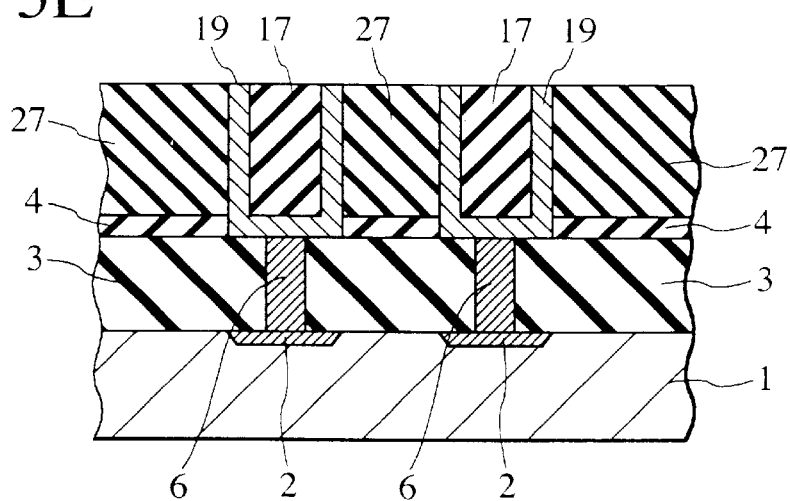

Subsequently, as illustrated in FIG. 5D, a polysilicon film 16 having n-type impurities is so formed as to cover the silicon dioxide film 27 having the openings 27a, using the CVD method. The polysilicon film 16 includes cavities 16a respectively in the openings 27a of the silicon dioxide film 27.

The polysilicon film 16 is so formed as to cover not only the upper surfaces and sidefaces of the silicon dioxide films 27 and the sidefaces of the silicon nitride film 4, but also the surfaces of the interlayer insulating film 3 which are exposed from the silicon nitride films 27. The polysilicon film 16 is a material for charge storage electrodes 19. The polysilicon film 16 is set in thickness at which the shape of the polysilicon film 16 is maintained even after the silicon dioxide film 27 is removed.

Next, silicon dioxide films 17 having no impurities are formed on the polysilicon film 16 using low pressure CVD method. The silicon dioxide films 17 are formed as to fill up at least the cavities 16a of the polysilicon film 16.

Then, the silicon dioxide films 17 overflowed outside the cavities 16a are etched back and removed therefrom using the dry etching technology. In this case, the silicon dioxide films 17 are so etched back as their upper surfaces to be slightly lower than the surfaces of the polysilicon films 16 on the silicon dioxide film 7a.

Next, the polysilicon film 16 which has been formed on the silicon dioxide film 27 (i.e., outside the cavities 16a) is selectively removed using the dry etching technique. Accordingly, the charge storage electrodes 19 which have the bottom and are formed in a cylindrical shape and whose upper ends are open are formed. In this case, the surfaces of the silicon dioxide films 27 are exposed.

Figure 5F:
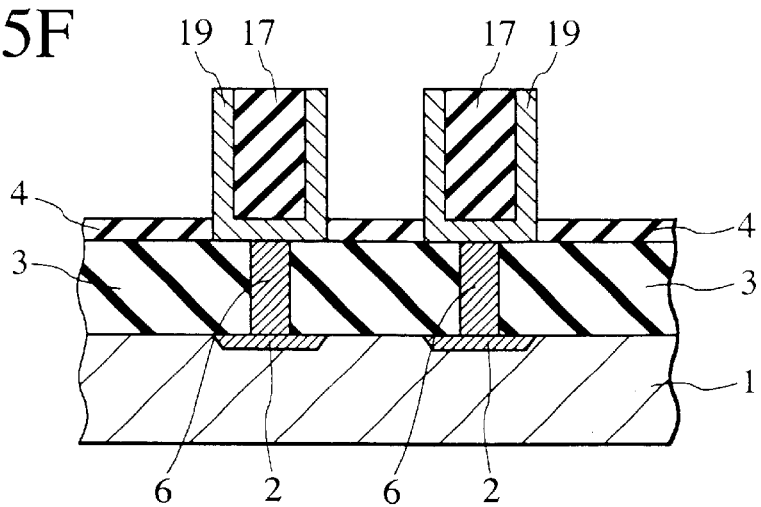

Subsequently, the silicon dioxide films 27 are so etched as to be removed using vapor phase hydrofluoric acid. The undoped silicon dioxide films 17 are formed inside the cylindrical charge storage electrodes 19. Since the silicon dioxide films 27 are made of silicon dioxide (for example, BPSG or PSG) having impurities, a difference in the etching rates of the silicon dioxide films 17 and the silicon dioxide films 27 can be obtained. Therefore, as shown in FIG. 5F, the silicon dioxide films 27 outside the charge storage electrodes 19 can be selectively removed therefrom. In this case, the silicon nitride film 4 has a function as an etching stopper for protecting the interlayer insulating film 3.

Figure 5G:
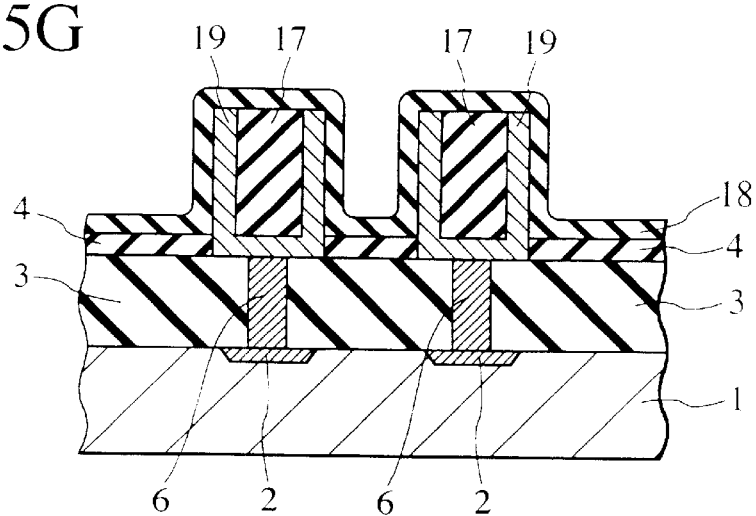

Next, a silicon dioxide film 18 is formed using the CVD method in such a way that It covers all of the charge storage electrodes 19, the silicon dioxide films 17 and the silicon nitride films 4, as illustrated in FIG. 5G.

Figure 5H:
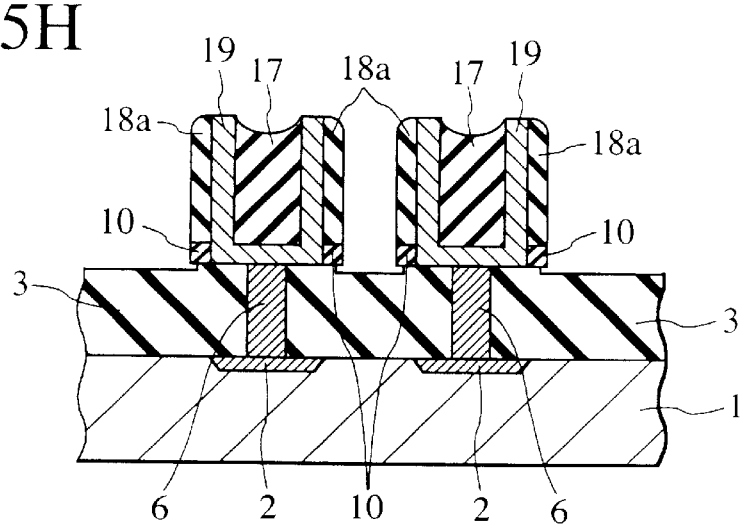

Then, the silicon dioxide film 18 is etched back using the dry etching technique. The silicon dioxide film 18 remains only along the periphery of the charge storage electrodes 19, so that insulating sidewalls 18a surrounding the charge storage electrodes 19 in a ring-like shape are formed. Subsequently, anisotropic etching is conducted toward the silicon nitride film 4, while the sidewalls 19a are used as etching masks, thereby selectively removing the silicon nitride film 4 therefrom. Accordingly, as illustrated in FIG. 5H, the insulating members 10 which are formed in a ring-like shape and surround the periphery of the charge storage electrodes 19 are thus formed.

Figure 5I:
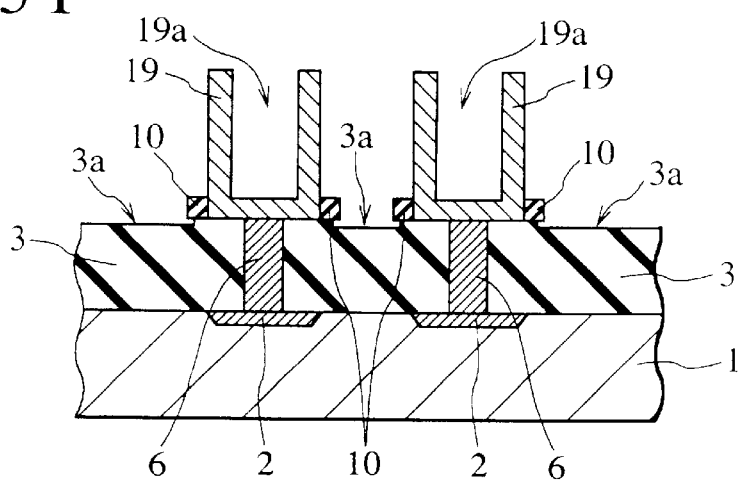

Furthermore, as shown in FIG. 5I, the undoped silicon dioxide films 17 and the undoped sidewalls 18a made of silicon dioxide are removed using the wet etching technique using dilute hydrofluoric acid, etc. Each of the charge storage electrodes 19 includes a cavity 19a, so that the charge storage electrodes 19 have the bottom and are formed in a cylindrical shape. In this etching technique, the interlayer insulating film 3 made of silicon dioxide is also slightly etched, however, any serious problems should not occur because of the presence of the cavities 3a, likewise in the first embodiment.

Next, the surface area of the charge storage electrodes 19 is nitrided, by heating the area in the atmosphere including nitrogen. Then, a silicon nitride film (not illustrated) is so formed that is covers all of the charge storage electrodes 19, the insulating members 10 and the exposed surface of the interlayer insulating film 3, using the CVD method, etc. The charge storage electrodes 19 are so oxidized using the thermal oxidation method as to form the capacitance insulating film 12 having the laminated layer structure, in which a silicon dioxide film and a silicon nitride film are laminated.

The plate electrode 13 is formed on the capacitance insulating film 12, by arranging a polysilicon film including the n-type impurities, etc., thereabove.

A capacitor included in a memory cell is thus formed of a single charge storage electrode 19 on which the capacitance insulating film 12 and the plate electrode 13 are formed.

As explained above, in the semiconductor memory device according to this embodiment, the insulating members 10 are formed only in the lower periphery of the respective charge storage electrodes 19 and do not cover the entire area between the charge storage electrodes 19. Accordingly, the presence of the insulating members 10 does not obstruct the hydrogen atom to be implanted into the interlayer insulating film 3 and the semiconductor substrate 1 likewise in the first embodiment. In the semiconductor memory device of this embodiment, the effects of the semiconductor memory device of the first embodiment can advantageously be achieved.

In the semiconductor memory device according to this embodiment, the charge storage electrodes 19 are formed in the cylindrical shape with the bottom, resulting in an increase in the surface area of the charge storage electrodes 19. In this case, an increase in the capacity of the capacitor can be achieved without increasing the chip area.

The present invention is not limited to the above-described embodiments, therefore, various modification can be made. For example, the charge storage electrodes 11 and 19 may be formed in any shape other than in the rectangular or cylindrical shape. Furthermore, the charge storage electrodes 11 and 19 may be formed in a shape having a concaved surface.

The capacitance insulating film 12 is formed of laminated layers of a silicon dioxide film and a silicon nitride film. However, needless to say, the capacitance insulating film 12 can be formed using a dielectric film having a high dielectric constant, such as a tantalum oxide ($Ta_2O_5$), etc. In such a case, it is enough to have one layer in the dielectric film, therefore, the number of manufacturing processes becomes small.

In the first and second embodiments, after forming the interlayer insulating film 3, a heat process for shaping the interlayer insulating film 3 by heating it up may be performed. Particularly, the interlayer insulating film 3 may be heated up at a temperature in a range between 600° C. and 800° C. for one to ten minutes using a well-known method. In the heat process, in the case of the first embodiment, an etching rate of the interlayer insulating film 3 can be sufficiently lower than that of the sidewalls 9a using the wet etching technique employing dilute hydrofluoric acid, etc. As a result of this, the cavities 3a of the interlayer insulating film 3 may not be formed.

In the second embodiment, the cavities 16a of the polysilicon film 16 may be filled with a known Spin-on-Glass (SOG) member, instead of using the silicon dioxide film 17 which can be formed using the low pressure CVD method. In this case, when removing the silicon dioxide films 27, a difference in the etching rates of the SOG member and the silicon dioxide films 27 can be obtained.

In the second embodiment, an anneal process for forming the silicon dioxide films 17 while heating them up can be performed before or after removing the silicon dioxide films 17 outside the cavities 16a. In such a case, when removing the silicon dioxide films 27, a difference in the etching rates of the silicon dioxide films 17 and 27 can be set large.

Various embodiments and changes may be made thereonto without departing from the broad spirit and scope of the invention. The above-described embodiments are intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. H10-317214 filed on Nov. 9, 1998 and including specification, claims, drawings and summary. The disclosure of the above Japanese Patent Application is incorporated herein by reference in its entirety.

What is claimed is:

1. A method of manufacturing a semiconductor memory device, comprising:

forming a first insulating film on an interlayer insulating film which is formed on a semiconductor substrate;

forming a second insulating film on the first insulating film;

forming a plurality of openings in the first insulating film and the second insulating film;

forming a plurality of charge storage electrodes on the interlayer insulating film by arranging an electric conductor in each of the openings;

removing the second insulating film;

forming a plurality of sidewalls surrounding the charge storage electrodes on the first insulating film;

etching the first insulating film using the sidewalls as etching masks, and removing the first insulating film except under the sidewalls, so as to form, on the interlayer insulating film, a plurality of insulating members which surround periphery of the charge storage electrodes and which are separated from each other;

removing each of the sidewalls;

forming a capacitance insulating film which covers the charge storage electrodes and the insulating members; and forming a plate electrode on the capacitance insulating film.

2. The method of manufacturing a semiconductor memory device according to claim 1, wherein each of the charge storage electrodes is formed, by arranging the electric conductor in the openings and on the second insulating film, thereafter etching back the electric conductor until a surface area of the second insulating film is exposed.

3. The method of manufacturing a semiconductor memory device according to claim 1, comprising:

arranging the electric conductor along inner walls of the openings, thereby forming a concaved portion in an inner wall of each of the charge storage electrodes.

4. The method of manufacturing a semiconductor memory device according to claim 1, further comprising forming the interlayer insulating film, thereafter performing a heat process for heating the interlayer insulating film in order to shape the interlayer insulating film.

5. The method of manufacturing a semiconductor memory device according to claim 1, wherein:

the interlayer insulating film is a silicon dioxide film; and the first insulating film is a silicon nitride film.

\* \* \* \* \*